United States Patent [19]
Maidhof et al.

[11] Patent Number: 5,993,556
[45] Date of Patent: Nov. 30, 1999

[54] VACUUM TREATMENT SYSTEM FOR DEPOSITING THIN COATINGS

[75] Inventors: Hans Maidhof, Goldbach; Hans Schüssler, Schiffweiler; Stefan Kunkel, Hanau; Johannes Beul, Rehe, all of Germany

[73] Assignee: Leybold Systems GmbH, Hanau, Germany

[21] Appl. No.: 09/057,551

[22] Filed: Apr. 9, 1998

[30] Foreign Application Priority Data

Apr. 12, 1997 [DE] Germany .............................. 197 15 245

[51] Int. Cl.$^6$ .................................................. C23C 14/00
[52] U.S. Cl. .............................. 118/719; 118/729; 118/50; 118/64; 118/500; 204/298.25; 204/298.26; 204/298.27; 204/298.28
[58] Field of Search ..................................... 118/719, 729, 118/50, 64, 500; 414/222, 935, 939; 204/298.28, 298.25, 298.26, 298.27

[56] References Cited

U.S. PATENT DOCUMENTS

| | | | |
|---|---|---|---|
| 5,288,379 | 2/1994 | Namiki et al. | 204/298.25 |
| 5,292,393 | 3/1994 | Maydan et al. | 204/298.25 |
| 5,709,785 | 1/1998 | LeBlanc, III et al. | 204/298.26 |
| 5,855,681 | 1/1999 | Maydan et al. | 118/719 |

*Primary Examiner*—Laura Edwards
*Attorney, Agent, or Firm*—Smith, Gambrell & Russell, LLP

[57] ABSTRACT

A vacuum treatment system for depositing thin coatings on substrates, with several stationary treating chambers that are held by the annular or frame-like side wall of the vacuum chamber and display the treatment tools and with treatment chamber openings aligned peripherally inward on the center of the vacuum chamber and extending in planes parallel to each other, a shaft, extending parallel to the opening planes and mounted in the vacuum chamber lid and/or in the vacuum chamber bottom plate of the vacuum chamber, is provided that moves the plates for closing the treatment chamber openings and is supplied with actuators for moving the closing plates from a radially inner opening position to a radially outer closing position, whereby the actuators working together with the shaft are designed as lever pinions.

4 Claims, 3 Drawing Sheets

VACUUM TREATMENT SYSTEM FOR DEPOSITING THIN COATINGS

INTRODUCTION AND BACKGROUND

The present invention relates to a vacuum treatment system for depositing thin coatings on substrates, with several stationary treating chambers that are held by an annular or frame-like side wall of the vacuum chamber and contain the processing tools, and with openings aligned on the center of the vacuum chamber and extending in planes parallel to each other.

A vacuum treatment system is known with a main chamber and/or distributor chamber (EP 0 555 764) inside which the substrates or work-pieces to be coated are conveyed by means of a conveyance mechanism between at least two processing chambers or between a storage lock chamber and at least one processing chamber. In this way, a portion or all of the processing chambers can be separated in sealed manner by means of hydraulically or pneumatically actuated seals from the main chamber and/or distributor chamber. The system is designed as a cylinder and at least one receiving chamber or one container for receiving the substrates to be processed is arranged along the casing of a circular or cylindrical distributor chamber, which are directed in the respective processing positions toward the corresponding processing stations arranged in the cylindrical casing in order to form the processing/process chambers. The receiving chambers/containers or the cylindrical casing are arranged rotating around the cylinder's center line.

A system is also known for depositing coatings on supports in a vacuum (DE 28 48 480), in particular for the alternate depositing of metal coatings and of luminous polymerization coatings on supports in the manufacture of electric film capacitors, which has at least two vacuum chambers that are separated from each other by vacuum locks and in which there is a lower remaining pressure in the first vacuum chamber during operation than in the second chamber or in the other chambers. This has a conveyance system that can convey each of the supports to be coated through a separate vacuum lock from the first vacuum chamber into the second vacuum chamber and again into the first chamber or into a third vacuum chamber. The vacuum chambers contains systems for depositing coatings onto the supports situated on the conveyance system. The vacuum locks each have several jaws that are situated opposite a surface or surfaces of the conveyance system and leave only a narrow gap open to it or them. Between each of the two jaws, there is a suction pipe for extraction of the remaining gas. The conveyance system is movable only in one direction and the vacuum lock situated before the first vacuum chamber in the moving direction of the conveyance system has longer diffusion paths than the vacuum lock situated after the first vacuum chamber.

SUMMARY OF THE INVENTION

An object of the present invention is to create a system in which the substrates are to be arranged in individual containers and, moreover, are to be laid out in such a way that substrates of different sizes and in particular with extremely intricate configuration can be processed.

Another object of the invention is to enable several different kinds of treatments of the substrates to be carried out without the vacuum chambers having to be ventilated and the substrates having to be transferred from substrate support to substrate support.

An achieving the above and other objects, one feature of the invention is an arrangement of several stationary treatment chambers held by the annular or frame-like side wall of the vacuum chamber and displaying the treatment tools, having treatment chamber openings aligned peripherally inward on the center of the vacuum chamber and extending in planes parallel to each other for transferring the substrates in and out of the lock. A shaft or screw spindle extends parallel to the planes of the openings and is mounted in the vacuum chamber lid and/or in the vacuum chamber bottom plate of the vacuum chamber, with plates held and moved by the shaft or spindle, for closing the treatment chamber openings. Actuators are provided for moving the closing plates from a radially inner opening position to a radially outer closing position, whereby the actuators working together with the shaft or the screw spindle are designed as lever pinions or telescopic extension arms and the closing plates have, on their side surfaces in each case facing the treatment chambers, substrate holders or grippers.

BRIEF DESCRIPTION OF DRAWINGS

The invention allows the widest variety of design possibilities; three thereof are shown in more detail in purely schematic form in the attached drawings; they show, namely.

DETAILED DESCRIPTION OF INVENTION

Figure 1:
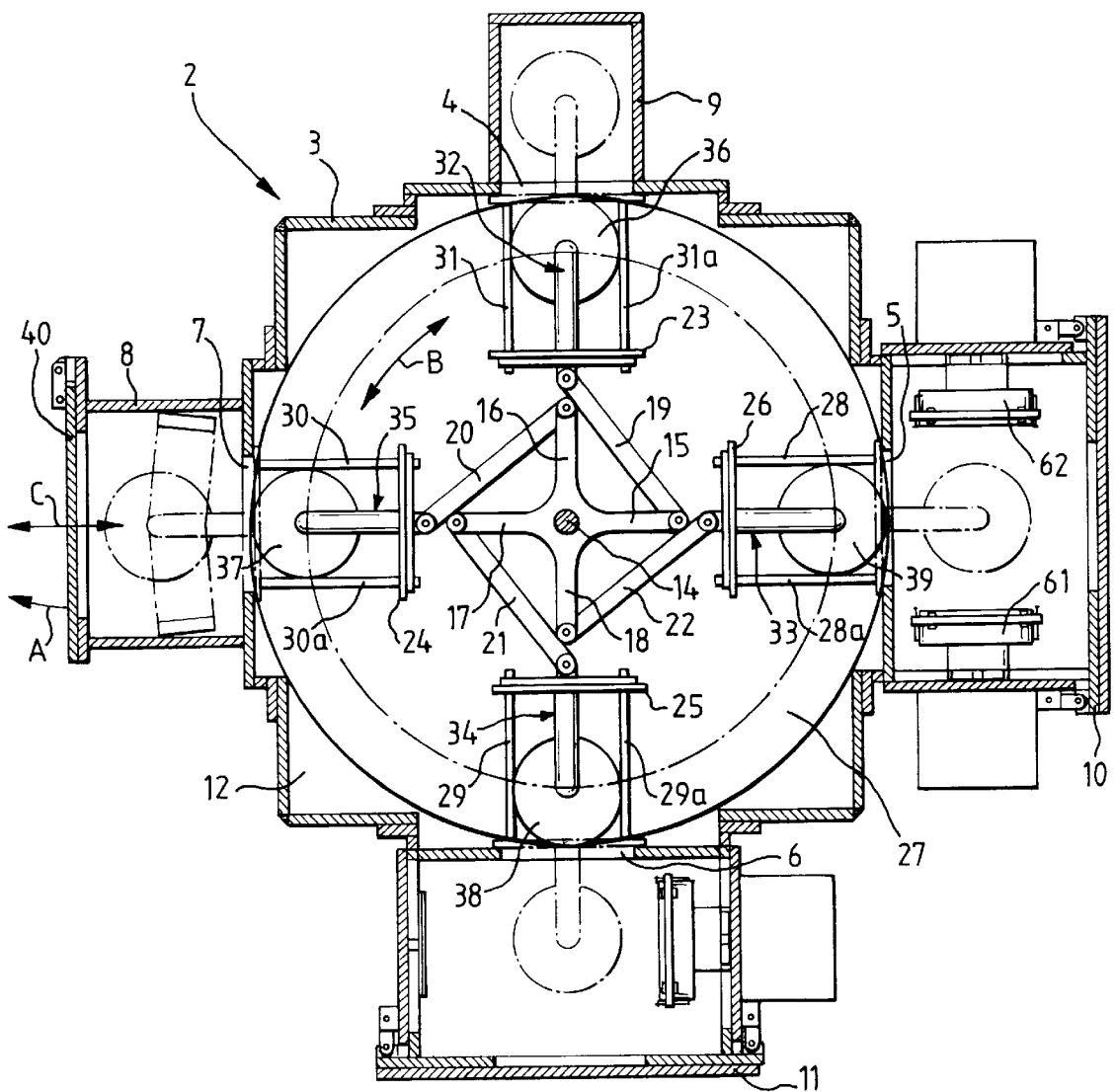
FIG. 1 is a cross-section view of a system with four closing plates that are able to be moved with the help of a slide guide by the turning motion of a shaft toward the lock openings situated opposite them in each case, for which purpose the closing plates slide in guide grooves of the rotating bottom plate.

As FIG. 1 shows, the vacuum treatment system consists essentially of a frame-like side part 3 with a total of four openings 4 through 7, the four box-shaped treatment chambers, a vacuum chamber bottom plate 12 to close the side part 3 toward the bottom, a vacuum chamber lid to close the side part 3 toward the top, the shaft 14 mounted rotating and vertically in the bottom plate 12 and the chamber lid with arms 15 through 18 attached to the shaft and extending radially horizontally, the pull struts/push struts 19 through 22 hinged to the arms 15 through 18, the closing plates 23 through 26 assigned to the respective treatment chambers 8 through 11 and hinged to the ends of the struts 19 through 22 and with the substrate supports attached to them, a guide plate 27 connected solidly with the shaft 14 and with, attached on it, pairs of rails 28 through 31 for mounting and guiding the closing plates 23 through 26 and the coating tools arranged in the four treatment chambers 8 through 11, such as glow discharge cathodes and sputter cathodes 41, 42.

For starting up the system shown in FIG. 1, the substrate supports 32 through 35 arranged fixed against the closing plates 23 through 26 are supplied with substrates 36 through 39; this is made possible, for example, in that the lid 40 of the treatment chamber 8 is opened in the direction of the arrow A and the substrates are guided through the treatment chamber and are suspended on the substrate support situated in each case before the opening 7, for which purpose the guide plate 27 can be rotated together with the shaft 14 and the closing plates 2 through 26 hinged to it (arrow direction B), and the closing plates 23 through 26 can, with stationary guide plate 27 but rotatable shaft 14, also be slid radially on the pairs of rails.

After the substrate supports 32 through 35 have been supplied with substrates 36 through 39 and the lid 40 is closed, the main chamber 2 and the treatment chambers 8 through 11 connected to it can be evacuated. If the shaft 14, with stationary guide plate 27, is then rotated approximately 90° counter-clockwise, all four closing plates 23 through 26 then move radially outward and the openings 4 through 7 are closed by them. By engaging the processing tools, e.g. the cathodes 41, 42, the substrates are then treated. If different kinds of tools are then arranged in the treatment chambers, each substrate can be conveyed in order of arrival into each of the four treatment chambers 8 through 11 and can be treated there in the desired order. The substrates 36 through 39 can be removed after successful treatment in the same way as they were supplied.

Figure 2:
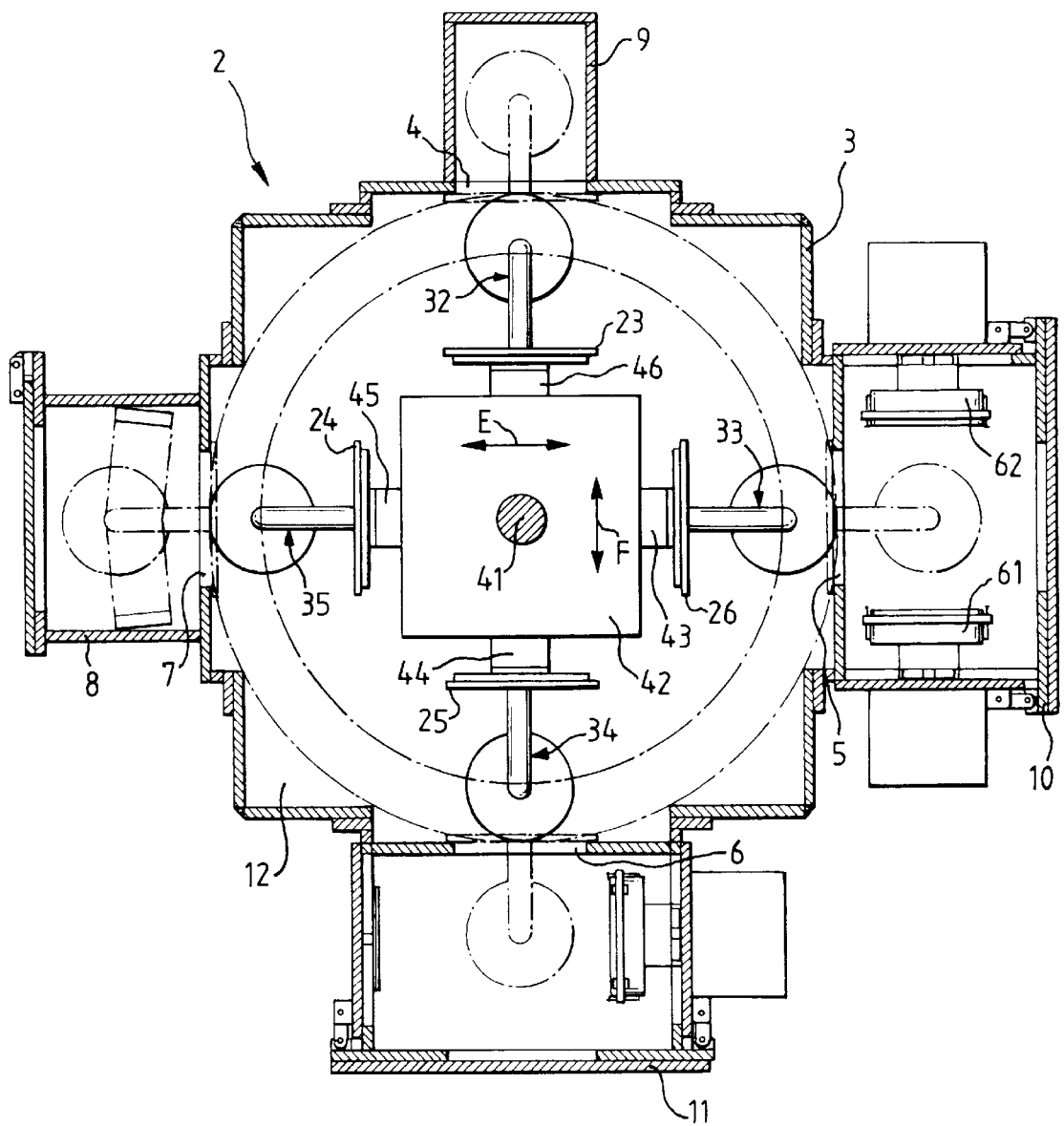
FIG. 2 is a cross-section view of another form of embodiment of the system, in which the closing plates can be moved with the help of telescoping extension arms, whereby the closing plates are provided, on their sides facing the treatment chambers, with arms for holding the substrate.

In the embodiment of the vacuum treatment system according to FIG. 2, instead of a shaft 14 with arms 15 through 18 with hinged tie bars/push struts 19 through 22 hinged to them, a housing 12 mounted rotating with the shaft 14 on the bottom plate 12 is provided with four extension arms 43 through 46 held and guided in it. These extension arms 43 through 46 can telescope in relation to the housing 12 in the direction of the arrows E/F in such a way that the closing plates 23 through 26 attached to the free ends of the extension arms 43 through 46 can be moved in front of the openings 4 through 7 or into the initial position shown in the drawing.

Figure 3:
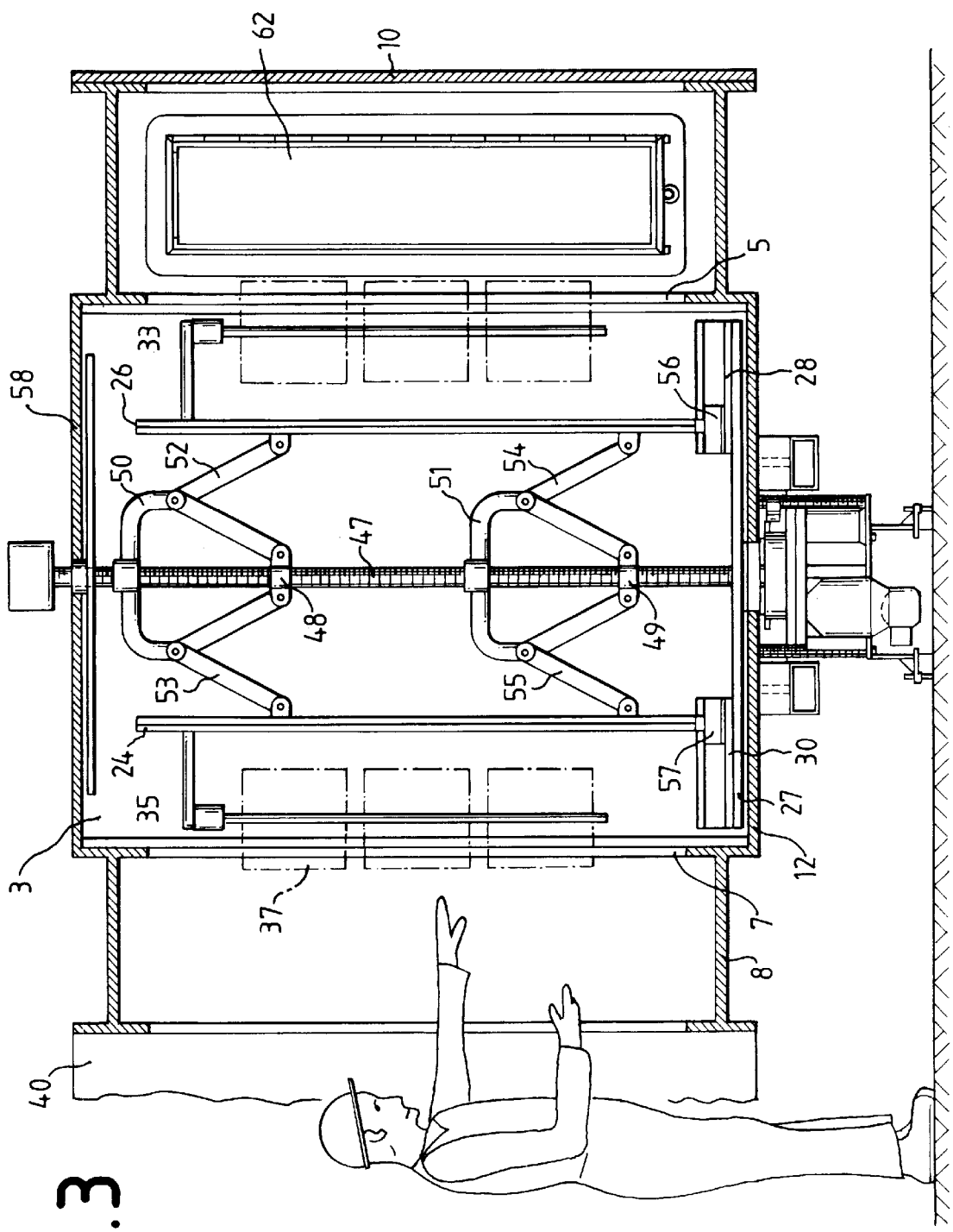
FIG. 3 is a longitudinal section view of another form of embodiment of the system, in which the closing plates can be moved radially with the help of levers that are coupled to the screw nut of a screw spindle.

The form of construction of the vacuum treatment system according to FIG. 3 has, instead of a shaft 14, a screw spindle 47 that works together with screw nuts 48, 49 that are parts of yokes 50,51 guided on the screw spindle. As a result of rotating movements of the spindle 47 the pull struts/push struts 52, 53/54, 55 hinged with the yokes 50, 51 push the closing plates 24, 26—depending on turning direction—radially outward or radially inward, whereby the closing plates 24, 26 are guided in the pairs of rails 28, 28a/30, 30a in which the closing plates 24, 26 engage with their guide shoes 56, 57.

While the pairs of rails 28, 28a, . . . , 31, 31a ensure that the closing plates 23 through 26 respectively assigned to them—in relation to the housing center line or to the shaft 14, or screw spindle 47—can only move in radial direction, the pull struts/push struts 19 through 22 or extension arms 3 through 6 or levers 52 through 55 ensure that in the case of a rotating movement of the shaft 14, or screw spindle 47 in relation to the guide plate 27, such a movement of all closing plates can only take place at the same time and in the same direction.

A synchronized rotating movement of the guide plate 27 and the shaft 14, or screw spindle 47 results in all closing plates 23 through 26 being moved at the same time together with the substrates 36 through 39 held by them in the direction of the arrow, that is, from one treatment station to the next—on condition that the closing plates 23 through 26 were moved into their initial position beforehand.

Further variations and modifications of the foregoing will be apparent to those skilled in the art and are intended to be encompassed by the claims appended hereto.

German priority application 917 15 245.7 is relied on and incorporated herein by reference.

We claim:

1. A vacuum treatment system for depositing a thin coating on a substrate, comprising a plurality of stationary treating chambers that are held by an annular or frame side wall of a vacuum chamber, each treatment chamber housing one or more treatment tools, and wherein each treatment chamber includes an opening facing inward toward the center of the vacuum chamber permitting transfer of the substrate in and out of a lock, and with a shaft or screw spindle extending parallel to the planes of the openings and mounted in a vacuum chamber lid and/or in a vacuum chamber bottom plate of the vacuum chamber, with closing plates held and moved by the shaft or spindle, for closing the openings to the treatment chambers, and with actuators for moving the closing plates from a radially inner opening position to a radially outer closing position, wherein the actuators include lever pinions connected to struts on the shaft or screw spindle, or telescopic extension arms, and wherein the closing plates include substrate holders or grippers facing the treatment chambers.

2. A vacuum treatment system for depositing a thin coating on a substrate, comprising a plurality of stationary treating chambers that are held by an annular or frame side wall of a vacuum chamber, each treatment chamber housing one or more treatment tools, a plurality of treatment chamber openings aligned peripherally inward on the center of the vacuum chamber and extending in planes parallel to each other for transferring the substrate in and out of a lock, and with a shaft or screw spindle extending parallel to the planes of the openings and mounted in a vacuum chamber lid and/or in a vacuum chamber bottom plate of the vacuum chamber, with closing plates held and moved by the shaft or spindle, for closing the treatment chamber openings and with actuators for moving the closing plates from a radially inner opening position to a radially outer closing position, whereby the actuators working together with the shaft or the screw spindle are lever pinions or telescopic extension arms and the closing plates include substrate holders or grippers facing the treatment chambers, wherein the shaft mounted in the vacuum chamber lid and/or in the vacuum chamber bottom plate has a number, corresponding to the number of treatment chambers of arms extending radially from the shaft and attached solidly to it, of arms whose radially outer ends are each connected via a pivoting bearing with a second lever or a push strut/pull strut whose free ends are each hinged to the closing plates which slide in slide guides that allow movement of the closing plates at right angles to the corresponding opening plane and are provided at the bottom plate and/or the chamber lid.

3. A vacuum treatment system for depositing a thin coating on a substrate, comprising a plurality of stationary treating chambers that are held by an annular or frame side wall of a vacuum chamber, each treatment chamber housing one or more treatment tools, a plurality of treatment chamber openings aligned peripherally inward on the center of the vacuum chamber and extending in planes parallel to each other for transferring the substrate in and out of a lock, and with a shaft or screw spindle extending parallel to the planes of the openings and mounted in a vacuum chamber lid and/or in a vacuum chamber bottom plate of the vacuum chamber, with closing plates held and moved by the shaft or spindle, for closing the treatment chamber openings and with actuators for moving the closing plates from a radially inner opening position to a radially outer closing position, whereby the actuators working together with the shaft or the screw spindle are lever pinions or telescopic extension arms and the closing plates include substrate holders or grippers facing the treatment chambers, wherein the shaft mounted in the vacuum chamber lid and/or in the vacuum chamber bottom plate is a screw spindle, whereby one or more screw nuts work with the screw spindle, said nuts connected to levers or push struts/pull struts whose free ends are each hinged to the closing plates, whereby the closing plates are held and guided in coulisses or pairs of rails that extend radially on a guide plate parallel to the bottom plate allowing movement of the closing plates at right angles to the respective opening plane.

4. A vacuum treatment system for depositing a thin coating on a substrate, comprising a plurality of stationary treating chambers that are held by an annular or frame side wall of a vacuum chamber, each treatment chamber housing one or more treatment tools, a plurality of treatment chamber openings aligned peripherally inward on the center of the vacuum chamber and extending in planes parallel to each other for transferring the substrate in and out of a lock, and with a shaft or screw spindle extending parallel to the planes of the openings and mounted in a vacuum chamber lid and/or in a vacuum chamber bottom plate of the vacuum chamber, with closing plates held and moved by the shaft or spindle, for closing the treatment chamber openings and with actuators for moving the closing plates from a radially inner opening position to a radially outer closing position, whereby the actuators working together with the shaft or the screw spindle are lever pinions or telescopic extension arms and the closing plates include substrate holders or grippers facing the treatment chambers, wherein the shaft mounted in the vacuum chamber lid and/or in the vacuum chamber bottom plate is connected with a number, corresponding to the number of treatment chambers, of extension arms that each can telescope radially toward the treatment chamber openings, whereby the free ends of the extension arms are each solidly connected with the closing plates, and whereby the closing plates are each provided, on their side surfaces facing the treatment chamber openings, with actuators each including a first arm, arranged solidly against the closing plates and extending roughly horizontally toward the respective treatment chamber openings, with, hinged to the first arm's free end, a second arm whose free end is provided with a substrate support or substrate gripper.

* * * * *